United States Patent [19]
Verma

[11] Patent Number: 5,892,662
[45] Date of Patent: Apr. 6, 1999

[54] "OPEN" CARD RACK ENCLOSURES

[75] Inventor: Yash P. Verma, Marlboro, N.J.

[73] Assignee: Lucent Technologies Inc., Murray Hill, N.J.

[21] Appl. No.: 782,704

[22] Filed: Jan. 13, 1997

[51] Int. Cl.$^6$ ..................................................... H05K 7/14
[52] U.S. Cl. .......................... 361/796; 361/729; 361/784; 439/61; 211/41.17
[58] Field of Search .................................... 361/724–728, 361/735, 748, 796, 797, 801, 802, 803; 439/61; 211/41.17

[56] References Cited

U.S. PATENT DOCUMENTS

| 2,986,281 | 5/1961 | Jordan .................................... 211/41.17 |
| 4,327,835 | 5/1982 | Leger ..................................... 211/41.17 |
| 4,704,599 | 11/1987 | Kimmel et al. ........................... 340/333 |
| 5,196,712 | 3/1993 | Nguyen et al. ........................... 250/551 |
| 5,394,305 | 2/1995 | Moral et al. .............................. 361/776 |

OTHER PUBLICATIONS

IBM, Technical Disclosure Bulletin, "Stackable Circuit Card Packaging Within a Logic Cage", vol. 35 No. 7, pp. 449 and 450, Dec. 1992.

Primary Examiner—Michael W. Phillips
Assistant Examiner—Jayprakash N. Gandhi

[57] ABSTRACT

A card rack is provided for removably housing two types of circuit packs in respective first and second portions, e.g., upper and lower portions of the card rack. The card rack includes connectors for interconnecting components on the circuit packs with one another and to input and output cables. The input cables are connected only to circuit packs of one type which are disposed only in one, e.g., the lower, portion of the card rack. The upper card rack portion overhangs the lower card rack portion for, in combination with sides of the card rack, forming a recessed space through which the input cables are routed to the lower portion circuit packs. The passage of the cables through the recessed space isolates the cables from becoming entangled with traffic passing in front of the card rack and thereby avoids the need for a separate door enclosing the front portion of the card rack. Preferably, the various circuit packs are relatively dimensioned for disposing innermost ends of the circuit packs in a common vertical plane for simplifying both the construction of the card rack and the arrangement used for interconnecting the various circuit packs.

7 Claims, 6 Drawing Sheets

"OPEN" CARD RACK ENCLOSURES

FIELD OF THE INVENTION

This invention relates to "card racks", that is, enclosures for removably housing circuit board assemblies containing electrical and/or optical components, and including conductive means for interconnecting the various components to one another and to input and output cables. In particular, the invention relates to an improved design for protecting cables protruding from various circuit board assemblies disposed within the card racks.

BACKGROUND OF THE INVENTION

In various applications involving complex electrical and/or optical equipment, such as large computers and telephone exchanges, there exists a need for interconnecting a large number of signal carrying "lines", e.g., metal wires or optical fibers, and for processing the signals being conveyed. Also, flexibility is required for readily changing the system architecture in response to changing needs, e.g., relocation and/or changing service requirements of subscribers to a telephone system.

For accommodating these requirements, "card racks" (or "card cages") have evolved. Such card racks comprise a relatively large enclosure including racks or shelves for removably receiving "cards", i.e., printed circuit boards known as "circuit packs". Each circuit pack includes a plurality of signal processing components mounted on a rigid plate including conductive paths for interconnecting the components to one another and to various connectors also mounted on the rigid plate. The circuit packs are removably mounted, generally in side-by-side relationship, within the card rack by sliding edges of the rigid plates along grooves within support walls of the card rack. Connectors at the leading ends of the rigid plates mate with connectors fixedly mounted within the card rack.

For ease of insertion and removal of the circuit packs (for changing the system configuration), the circuit packs are fully accessible at a front surface of the card rack. Signal carrying lines disposed within cables are connected to various ones of the circuit packs at the card rack front surface, and the cables project forwardly from the card rack front surface before being led away through various cable conduits or channels.

A problem, and particularly in large rooms containing many side-by-side disposed card racks, is that the forwardly projecting cables at the front surfaces of the card racks are subject to being snared by or entangled with traffic passing in front of the card racks, e.g., attendants and equipment carrying carts. One common solution is to provide hinged front doors for enclosing both the front surfaces of the card racks and the portions of the cables projecting immediately forwardly thereof.

The use of hinged front doors, however, presents a new set of problems in that the doors add complexity and expense to the card racks; add delays in obtaining access to the card racks; and inevitably provide dangerous obstacles to traffic passing in front of the card racks.

SUMMARY OF THE INVENTION

The front surface of a card rack according to this invention has a "stepped" or "recessed" configuration including, in a preferred embodiment, a first front surface portion generally lying in a first vertical plane, and a second front surface portion generally lying in a second vertical plane, and with the first vertical plane being set back from or recessed relative to the second vertical plane.

According to a first aspect of the invention, two types of circuit packs are to be housed in the card rack; a first type to which front surface signal lines are connected; and a second type to which no front surface signal lines are to be connected. The first type of circuit packs are disposed only in the first, recessed portion of the card rack, and the second type of circuit packs are disposed in the second portion of the card rack. The extent of set-back between the first and second front surface portions is such that, while the signal lines connected to the first circuit packs in the recessed portion of the card rack project forwardly from their respective circuit packs, the signal lines do not break the vertical plane established by the circuit packs in the second (forwardly projecting) portion of the card rack, hence, are isolated from passing traffic. A hinged front door for closing the card rack is thus not required, and the inventive card racks are always in "open" condition.

According to a second aspect of the invention, the first type of circuit packs disposed in the first recessed portion of the card rack have a shorter front-to-back length than that of the second type of circuit packs, with the difference in lengths being equal to the set-back distance between the card rack first and second front surfaces. This allows disposing all the inner connectors of the card rack, with which connectors on the leading ends of the circuit packs are to mate, along a vertical plane, e.g., along a straight rear wall of the card rack. As described hereinafter, this simplifies the making of interconnections between respective circuit packs for both simplifying the card rack construction as well as providing high quality signal couplings.

DESCRIPTION OF THE DRAWING

The drawings are not necessarily to scale and are partially schematic.

FIGS. 1–4 are perspective views of a card rack in accordance with this invention wherein:

FIG. 1 is a view towards the front of the card rack while empty;

FIG. 2 is also a view towards the front but when the card rack includes circuit packs therewithin and with the top outer and right-hand side walls of the card rack removed;

FIG. 3 is similar to FIG. 1 but viewing the card rack from the rear and with the rear outer wall of the card rack removed;

FIG. 4 is similar to FIG. 3 but with circuit packs within the card rack;

DESCRIPTION OF PREFERRED EMBODIMENT OF THE INVENTION

As previously explained, card racks are well known. Accordingly, only details relevant to the present invention are herein described and illustrated.

FIGS. 1–4 show an illustrative card rack 10 according to the invention. Except as hereinafter described, it can be substantially identical to known card racks in that, for example, it comprises a rigid and self-standing box-like structure having side walls 12 and an inner or rear wall 14. Uncommonly, however, the card rack is of an "open" configuration in that it does not include a hinged front door such as generally used in known card racks. Another difference is that the card rack is divided into upper and lower portions with one of the portions set back from the other. This is described hereinafter.

Figure 1:
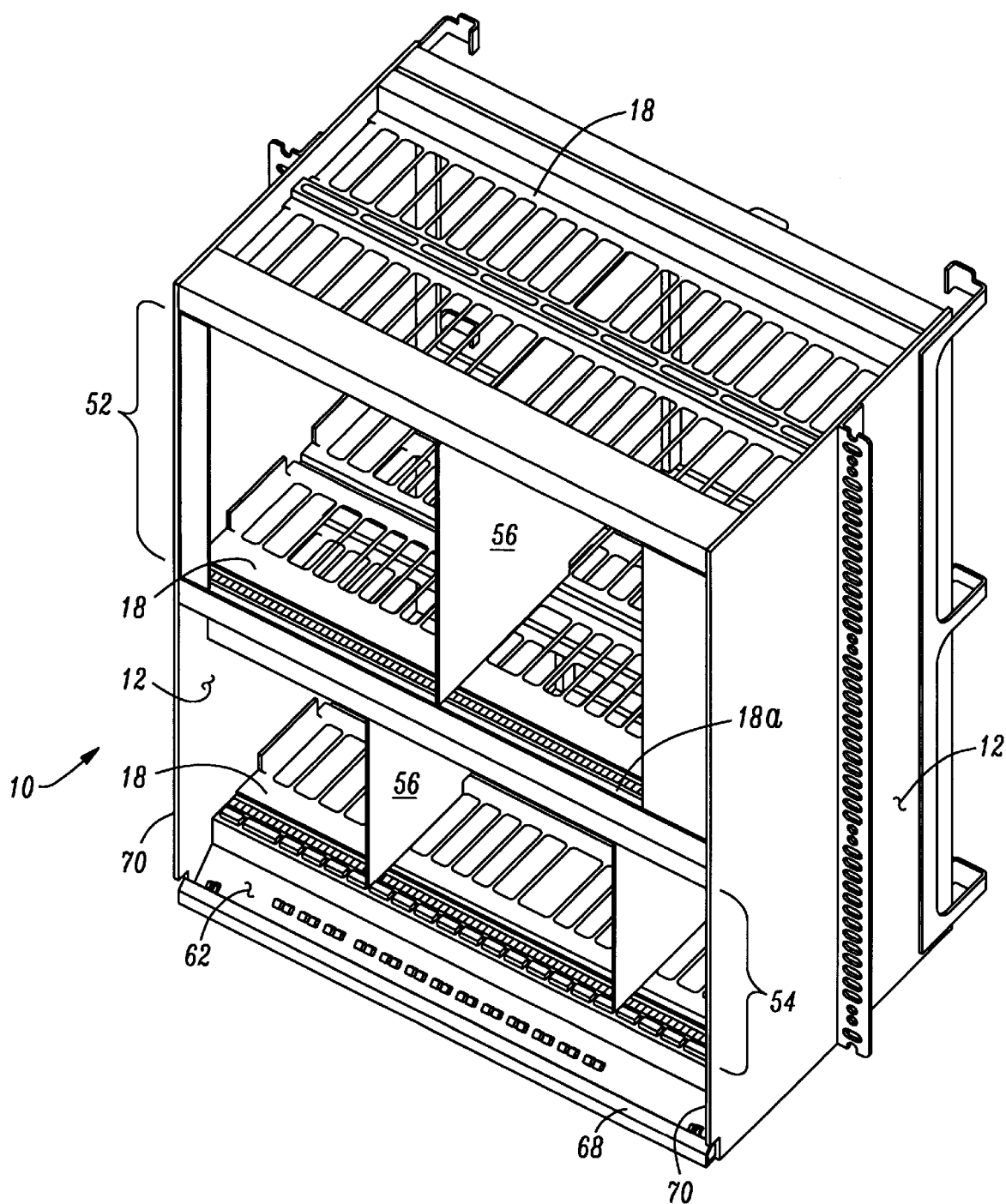
Figure 5:
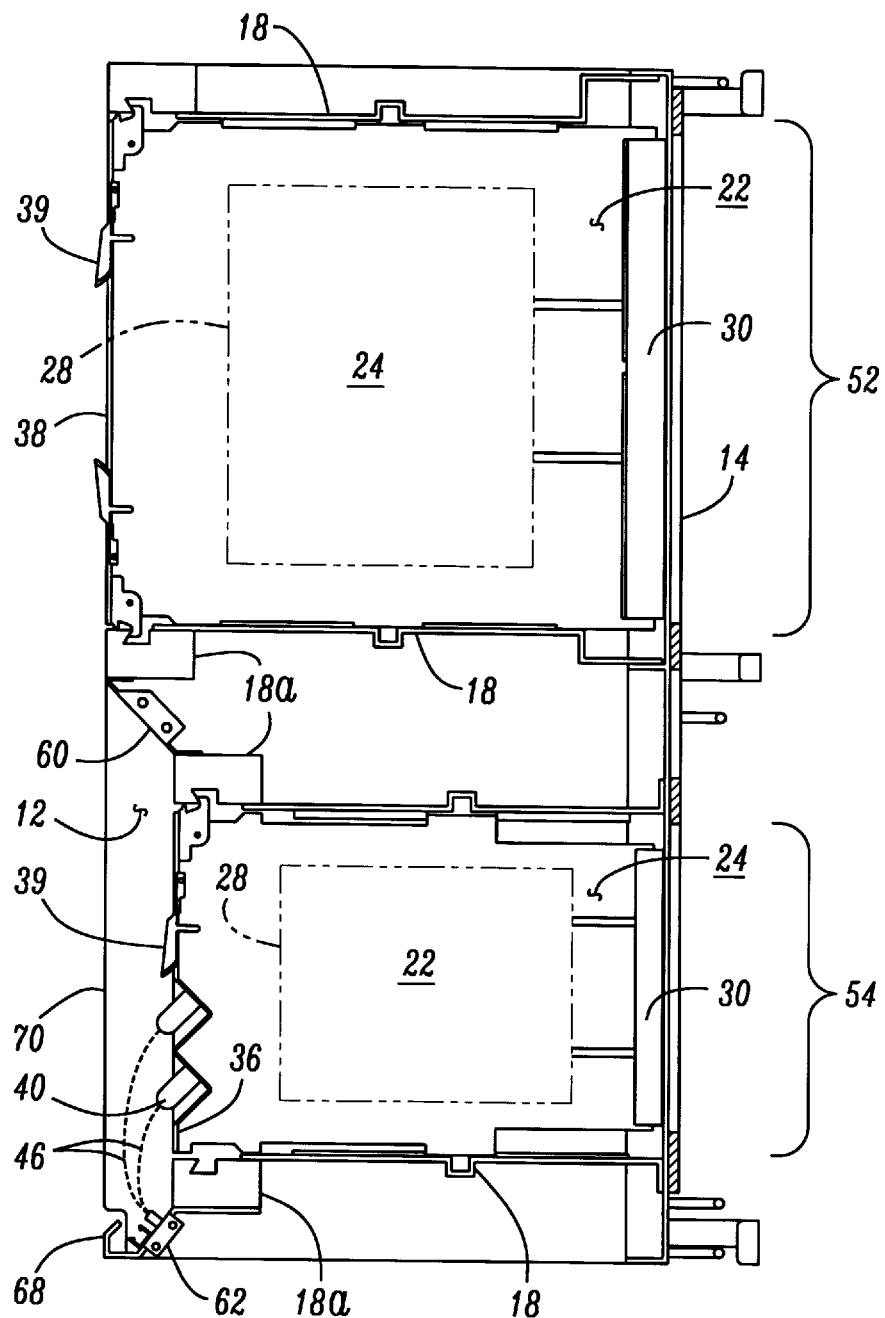
FIG. 5 is a vertical side section taken through the card rack shown in FIG. 2 and looking in the direction, in FIG. 2, from right to left.

As with known card racks, the inventive card rack is to removably house and provide interconnections for known types of circuit packs (described hereinafter). To this end, the structure includes a plurality of grooved, horizontally disposed shelves 18 for receipt of circuit packs in side-by-side vertical orientation (similarly as books stacked on library shelves). As shown in FIGS. 1 and 5, an upper-most shelf 18 doubles as a "top" wall of the card rack and a bottom-most shelf 18 serves as a "bottom" wall. Added strength is provided by horizontally extending members 18a at the front (FIG. 1) of the card rack to which the shelves 18 are secured. In other embodiments, not illustrated, the circuit packs are disposed in horizontal orientation and are removably disposed within horizontal grooves in spaced apart vertical "shelves", e.g., side walls of the card rack.

Typically, the circuit packs extend the entire front-to-back depth of the card rack. For convenience, the terms "rear" and "front" are used with respect to the structure shown in FIGS. 1–4. Thus, circuit packs (see also, FIGS. 6 and 7) have "rear" ends which are disposed adjacent to the rear wall of the card rack, and "front" plates which, typically, form a front surface of the card rack.

In a preferred embodiment of the invention, circuit packs of two types are used with the inventive card rack. Both types are generally known, but the disposition of the circuit packs within the card rack is of significance according to this invention.

Figure 6:
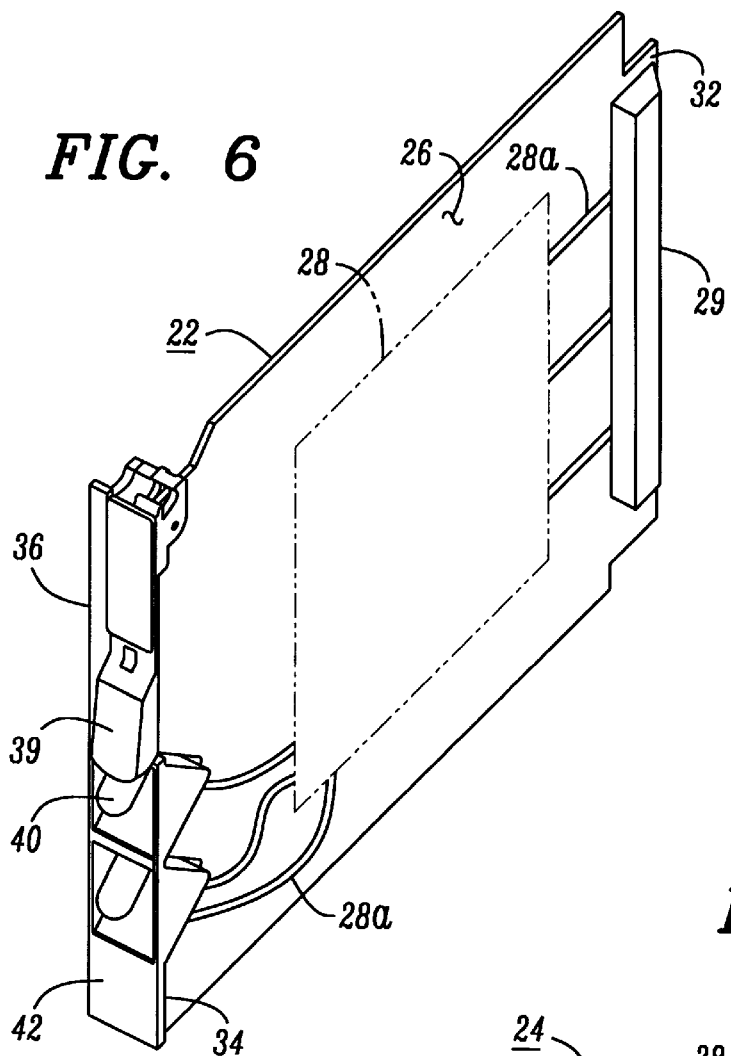
FIG. 6 is a perspective view of a circuit pack similar to a circuit pack shown in the lower portion of the FIG. 5 illustrated card rack.
Figure 7:
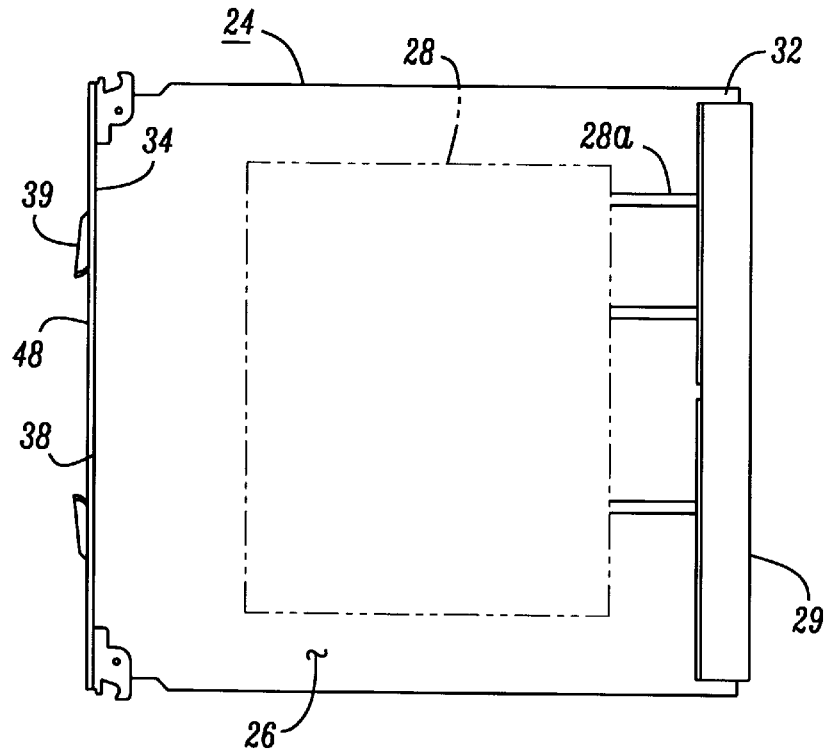
FIG. 7 is a side elevation of a circuit pack similar to a circuit pack shown in the upper portion of the card rack as shown in FIG. 5.

A first type of circuit pack 22 is schematically shown in FIG. 6, and the second type of circuit pack 24 is shown in FIG. 7. The two circuit packs 22 and 24 can be substantially identical in that they each comprise a rigid printed circuit board 26 of known type on which various electrical and/or optical components (indicated schematically by the use of dash line boxes 28) are mounted. Electrical and/or optical conductors 28a are disposed on the circuit boards for interconnecting the various components on the boards to one another and to rearwardly facing connectors 29 mounted at the rear edges 32 of the boards. The connectors 29 can be of known type and are shown schematically as vertically extending boxes. The connector boxes 29 contain pins and/or sockets for mating with matching connectors 30 (FIG. 5) fixedly mounted on the rear wall 14 of the card rack.

The front edges 34 of the boards 26 of the two types of circuit packs 22 and 24 are rigidly secured to front plates 36 and 38, respectively. A significant difference between the two circuit packs is that the circuit pack 22 of the "first" type (FIG. 6) includes connectors 40 (shown schematically) of known type on the frontwardly facing surface 42 of the front plate 36 for connection to mating connectors mounted at the ends of cables containing signal carrying "lines", e.g., metal wires and/or optical fibers. Such cables 46 are indicated by dash lines in FIG. 5. The various signal carrying lines are connected to various components 28 on the board 26 by means of the mating connectors 40 and conductive paths 28a extending from the connectors 40 through the front plate 36 and along the board.

The circuit pack 24 of the second type (FIG. 7) is not connected to cables at the front surface 48 of the front plate 38, and no connectors are mounted on the front plate 38.

As mentioned, circuit packs of both types herein described are known. Circuit packs 22 to which input cables 46 are connected can provide, for example, "initial" processing of signals carried by the cable lines. "Secondary" or additional processing is provided, as required, by components on circuit packs 24 of the second type which are interconnected to respective circuit packs 22 of the first type via the aforementioned connectors 30 mounted on the rear wall 14 of the card rack.

It frequently occurs that, owing to the system architecture, lay-out of the card rack connecting scheme and the like, different size circuit packs are used within a given card rack. While this is generally known, it is arranged, in accordance with a second aspect of the invention, that the front-to-back lengths of all the circuit packs of each respective type are the same, while the front-to-back lengths of the first type of circuit packs are less than those of the second type of circuit packs by a preselected amount. A reason for this is shortly to be described. No restraint is imposed on the vertical heights of the various circuit packs. As described below, each type of circuit pack fits within a respective vertically extending portion of the card rack.

Figure 2:
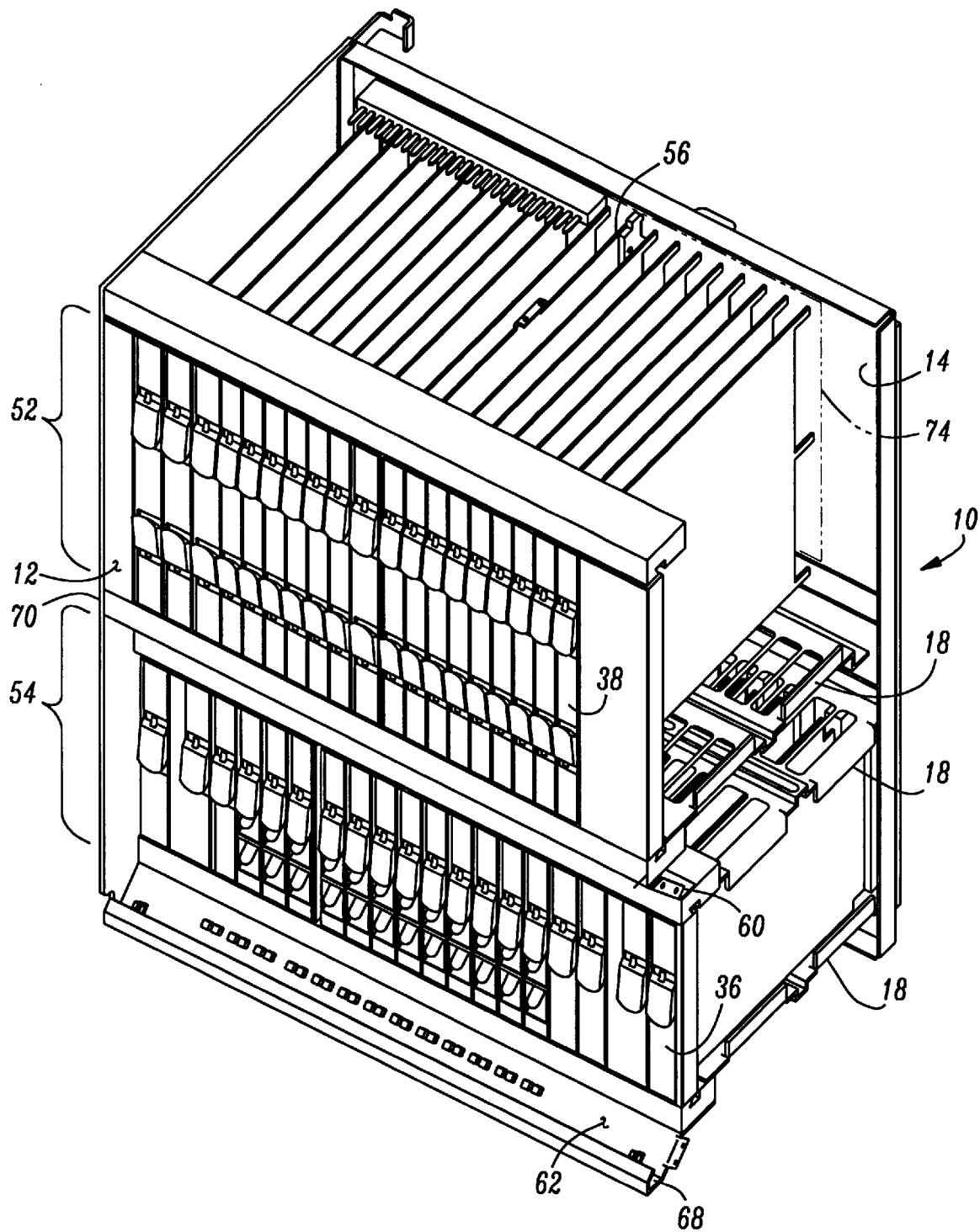
Figure 3:
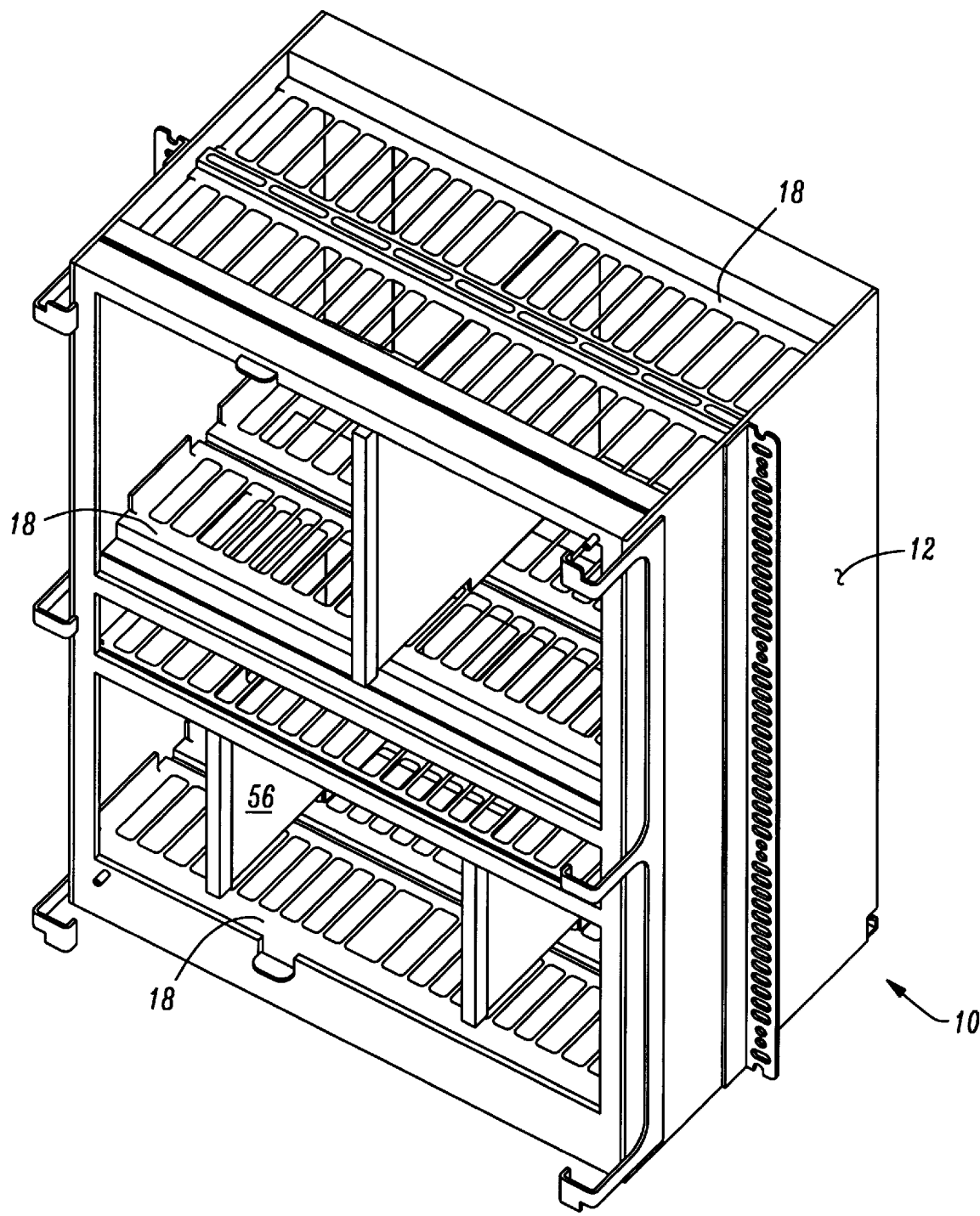
Figure 4:
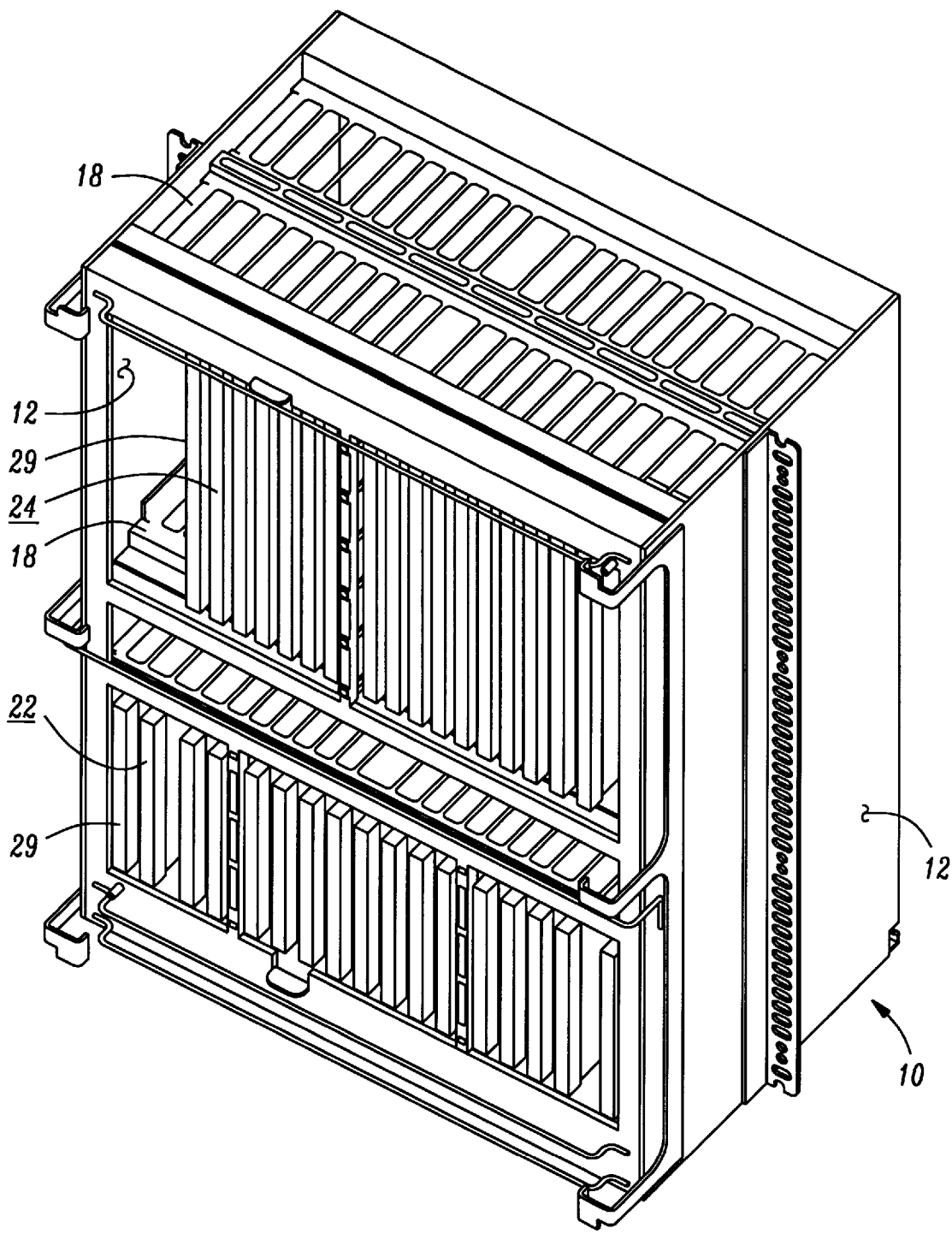

As shown in the front views of the card rack in FIGS. 1 and 2, but best shown in FIG. 5, the inventive card rack 10 is divided into upper 52 and lower 54 portions having different front-to-back depths, with the upper portion 52 depth, in the embodiment, being greater than the lower portion depth. The rear wall 14 of the card rack preferably lies in a vertical plane, and the different depths result in the lower portion 54 being set-back or recessed relative to the upper portion 52. The significance of this is discussed hereinafter. Circuit packs 24 of the second type are shelved in the upper portion 52 of the card rack 10 by being slid along vertically aligned pairs of grooves in a pair of vertically spaced apart horizontal shelves 18, and circuit packs 22 of the first type are similarly shelved in a pair of shelves 18 in the lower portion 54.

When the circuit packs are properly and fully inserted into the card rack 10, the various connectors 29 on the rear edges 32 of all the circuit packs engage with respective mating connectors 30 mounted on the card rack rear wall 14. All the front plates 36 and 38 of all the circuit packs typically include latching mechanisms 39 for locking the circuit packs firmly in place within the card rack, and additionally include handles (not illustrated) by means of which the circuit packs can be handled.

For ready access to the card rack shelves, for ease of insertion and removal of the circuit packs, the front of the card rack is completely open (FIG. 1) and, when empty, the card rack has the appearance of an open book case. (FIG. 1 shows vertical dividers 56 for added strength and for electrical shielding purposes as may be required). Conversely, when the circuit packs are assembled within the card rack (FIG. 2), the front plates 36 and 38 of the various circuit packs form a front wall or front surface of the card rack. Preferably, the respective front plates 36 and 38 of the side-by-side positioned circuit packs fit together so closely as to provide a substantially continuous and closed front surface of the card rack. This serves to close off the card rack interior for protecting the various components therein from air borne dirt.

As previously described, in this embodiment, the front surface of the lower portion 54 of the inventive card rack is set back from or recessed relative to the upper portion 52 of the card rack. Both upper and lower front surfaces lie in respective vertical planes. For interconnecting the two front surfaces, the card rack structure includes an inclined plate 60 (barely visible at the right in FIG. 2 but shown clearly in FIG. 5) extending downwardly and inwardly from the shelf support 18a at the front edge of the shelf 18 at the bottom of the card rack upper portion 52 to the shelf support 18a at the front edge of the shelf 18 at the top of the card rack lower portion 54. This plate 60, along with an inclined horizontally extending plate 62 at the bottom of the card rack, combine with the front surfaces created by the front plates of the circuit packs to provide a continuous and generally closed front surface of the card rack 10.

As previously described, circuit packs 24 of the second type to which no input cables are connected are disposed in the upper portion 52 of the card rack 10, while circuit packs 22 disposed in the lower portion 54 have input cables 46 connected thereto. Typically, all the input cables 46 (FIG. 5) coming to the card rack are first directed into a common channel 68 mounted at the bottom of the card rack structure, with respective cables emerging along the length of the channel for extension to and connection to respective lower portion circuit packs 22. Although the channel 68 is disposed forwardly of the front surface formed by the lower portion circuit packs, the extent of set-back of the lower portion 54 of the card rack is sufficient to dispose the channel 68 rearwardly of the front surface vertical plane established by the upper portion circuit packs.

Between the channel 68 and the circuit packs 22, the cables follow an arched or looped path. In this embodiment, the cables 46 contain optical fibers for transmitting light and, as known, it is important that the optical fibers are not sharply bent for preventing damage of the cables. Thus, the cable loops have a minimum radius of curvature and, as shown in FIG. 5, project forwardly from the outwardly facing surfaces of the circuit packs 22. These radii may be different for different types of cables, and the "recessed area" can be adjusted accordingly for different cable types.

Such looped cables, at the preferably fully accessible front surface of the card rack, are normally, in prior art card racks, all too easily snared by traffic passing in front of the card racks. For avoiding this problem, prior art card racks typically contain hinged front doors for closing off the otherwise accessible front surface of the card racks. Such doors, however, present problems previously described.

In the inventive "open" card racks, doors are not required and the front surfaces of the card rack remain fully open and fully accessible to attendants. The danger and likelihood of snagging of the necessarily looped cables are substantially avoided by disposing the looped cables within the aforementioned front recess of the card rack. Such recess is primarily formed by the set-back of the surface formed by the front plates of the lower portion circuit packs from the surface formed by the front plates of the upper portion. Secondarily, but importantly, the recess is also defined by the side walls 12 of the card rack which, in the illustrated embodiment, have straight forwardly facing edges 70 lying in the vertical front plane or surface of the card rack upper portion 52. Accordingly, the lower portion of the card rack is set-back, or recessed inwardly, from the side wall forward edges 70.

When metal wire cables are used, the problem of large loops of accessible cables at the front of a card rack can be reduced somewhat (metal cables can be bent relatively sharply with no impairment of function). But even with metal cables, the need for hinged doors has existed in the past, and the present invention also has utility with wire cables.

As mentioned, in a preferred embodiment, the difference in front-to-back lengths of the two types of circuit packs 22 and 24 used in the card rack 10 is equal to the set-back distance between the upper 52 and lower 54 portions of the card rack. Accordingly, the rear edges of all the circuit packs terminate in a common vertical plane, e.g., the rear wall 14 of the card rack. The rear wall 14 can thus be straight and of non-stepped configuration.

An advantage of this is that signal interconnections between various components on circuit packs in respective upper 52 and lower 54 portions of the card rack can be by means of rigid and flat printed circuit boards of known type extending in a single vertical plane and without interruption along the rear wall 14 of the card rack. This greatly simplifies the upper and lower portion signal interconnecting scheme and, in general, provides improved signal transmission results as well.

Such interconnecting circuit boards are not fully shown in the drawing but indicated schematically by the dash line 74 in FIG. 2. The location of the circuit boards can also be visualized from FIG. 4 which shows the rear surfaces of vertically extending contacts 29 (see also, FIGS. 6 and 7) fixedly attached to the rearwardly facing edges of the circuit boards 26 of the circuit packs 22 and 24. As previously explained, the connectors 29 are forced into mating engagements with corresponding connectors 30 (FIG. 5) which can be mounted on printed circuit boards (not shown) fixedly mounted on the rear wall 14 of the card rack. Depending upon the interconnecting schemes involved, the rear wall mounted printed circuit boards extend, e.g., vertically, for interconnecting connectors 29 on circuit packs 24 in the upper portion of the card rack with circuit packs 22 in the card rack lower portion.

As described, protection of the front cables 46 (FIG. 5) is provided by the set-back of the lower portion 54 of the card rack relative to the upper portion 52 thereof. The set-back arrangements can be reversed, with the upper portion 52 being set-back from the lower portion 54. In such case, the smaller front-to-back circuit packs 22 of the "first" type are disposed in the set-back upper portion 52, and the circuit packs 24 of the "second" type are disposed in the lower portion 54.

As mentioned, an important dimension of the circuit packs 22 and 24 is their relative front-to-back depths. The vertical heights are not particularly relevant and can vary from circuit pack to circuit pack provided the various "types" can be properly loaded into their respective upper and lower portions. Also, while it is preferred that all the front cables 46 are routed only to circuit packs within the recessed portion of the card rack, the recessed portion can include circuit packs to which no cables are connected.

What is claimed is:

1. A combination comprising a card rack having front, rear, side and bottom surfaces and first and second types of circuit packs for being housed within respective first and second adjoining portions of the card rack, all said circuit packs comprising a front plate for disposition at a front surface of the card rack and a component carrying plate secured to said front plate for extending inwardly of the card rack, the combination being for coupling cables extending from locations external to the card rack to components mounted on said circuit packs, said first type of circuit packs including means for being directly connected to respective cables, and said first portion of the card rack being off-set from said second portion of the card rack in a direction towards the rear of the card rack for disposing the front plates of said first type of circuit packs housed within said first portion rearwardly of the card rack relative to the positions of the front plates of said second type of circuit packs housed within said second portion of the card rack.

2. A combination according to claim 1 wherein frontly facing surfaces of the front plates of said first and second types of circuit packs housed in the card rack define respective first and second generally parallel front surface portions of the card rack, said front surface portions being spaced apart a preselected distance in the front-to back direction of the card rack, and all of said second type of circuit packs have a common front-to-back depth which is greater than that of all of said first type of circuit packs by an amount equal to said preselected distance between said first and second front surface portions.

3. A combination according to claim 2 wherein said cable connecting means are disposed on said frontly facing surfaces of said front plates of said first type of circuit packs, and wherein none of said second type of said circuit packs includes cable connecting means on the frontly facing front surfaces of the front plates thereof.

4. A combination according to claim 3 wherein only circuit packs of the second type are disposed within said second portion of the card rack, and all of said circuit packs have connectors disposed along rear edges thereof in mating contact with respective connectors disposed in a vertical plane and mounted on a rear wall of the card rack.

5. A combination according to claim 1 wherein the off-set between said first and second portions of the card rack defines a space disposed rearwardly of a projection of the first surface of said second portion of the card rack past the front surface of said first portion of the card rack, and including means for routing lengths of cables through said space for being connected to said first type of circuit packs housed within said first portion of the card rack, said routing being such that the entire lengths of said cables within said space are disposed rearwardly of said projection of the front surface of said second portion.

6. A card rack having front, rear, side and bottom surfaces for housing first and second types of circuit packs within respective first and second adjoining portions of the card rack, all said circuit packs comprising a front plate for disposition at a front surface of the card rack and a component carrying plate secured to said front plate for extending inwardly of the card rack, said first type of circuit packs including means on said front plate thereof for being directly connected to a signal line cable, and said first portion of the card rack being off-set from said second portion of the card rack in a direction towards the rear of the card rack for disposing the front plates of said first type of circuit packs housed within said first portion rearwardly of the card rack relative to the positions of the front plates of said second type of circuit packs housed within said second portion of the card rack.

7. A card rack according to claim 6 wherein the off-set between said first and second portions of the card rack defines a space disposed rearwardly of a projection of the first surface of said second portion of the card rack past the front surface of said first portion of the card rack, and including means for routing lengths of cables through said space for being connected to circuit packs housed within said first portion of the card rack, said routing being such that the entire lengths of said cables within said space are disposed rearwardly of said projection of the front surface of said second portion.

* * * * *